United States Patent [19]  [11] Patent Number: 5,069,997
Schwalm et al.                [45] Date of Patent: Dec. 3, 1991

[54] POSITIVE AND NEGATIVE WORKING RADIATION SENSITIVE MIXTURES AND PRODUCTION OF RELIEF PATTERNS

[75] Inventors: Reinhold Schwalm, Wachenheim; Horst Binder, Lampertheim, both of Fed. Rep. of Germany

[73] Assignee: Keil & Weinkauf, Ludwigshafen, Fed. Rep. of Germany

[21] Appl. No.: 352,459

[22] Filed: May 16, 1989

[30] Foreign Application Priority Data

May 19, 1988 [DE] Fed. Rep. of Germany ....... 3817012

[51] Int. Cl.$^5$ .................. G03C 7/039; G03C 7/038
[52] U.S. Cl. ....................................... 430/270; 522/31
[58] Field of Search ........................... 522/31; 430/270

[56] References Cited

U.S. PATENT DOCUMENTS

| | | | |
|---|---|---|---|
| 3,779,778 | 12/1973 | Smith et al. | 96/115 R |
| 4,294,909 | 10/1981 | Lee | 430/291 |
| 4,356,252 | 10/1982 | Lee | 430/270 |

FOREIGN PATENT DOCUMENTS 0146411 of 0000 European Pat. Off. .
62-38450 2/1987 Japan ................................... 430/270

OTHER PUBLICATIONS

Crivello, "Org. Coatings and Appl. Polymer Sci.", 48, pp. 65–69 (1985).
Pampalone—"Solid State Technology", Novolak Resins Used in Positive Resist Systems, Jun. 1984, pp. 115–120.

Primary Examiner—Cynthia Hamilton
Attorney, Agent, or Firm—Keil & Weinkauf

[57] ABSTRACT

Positive and negative working radiation sensitive mixtures suitable in particular for producing relief patterns contain a polymeric binder and an organic compound whose solubility in an aqueous alkaline developer is increased by the action of acid and which contains at least one acid cleavable group and also an additional group which upon irradiation forms a strong acid, the polymeric binders being reaction products of polymers that contain phenolic hydroxyl groups with dihydropyran or with alkyl vinyl ethers.

7 Claims, No Drawings

POSITIVE AND NEGATIVE WORKING RADIATION SENSITIVE MIXTURES AND PRODUCTION OF RELIEF PATTERNS

The present invention relates to positive and negative working radiation sensitive mixtures which contain a polymeric binder and a compound which contains at least one acid cleavable bond and on irradiation forms a strong acid, the solubility of the compound in an alkaline solvent being increased by the action of the acid. These mixtures are sensitive to UV, electron beams and X-rays and are suitable in particular for use as resist materials.

Positive working radiation sensitive mixtures are known. In commerce, use is made in particular of positive working resist materials which contain o-quinonediazides in binders which are soluble in aqueous alkali, for example novolaks or poly(p-vinylphenol)s. However, the sensitivity of these systems to radiation, in particular shortwave radiation, is not always satisfactory.

Sensitivity increases in radiation sensitive systems which in the primary photoreaction produce a species which then, independently of the radiation, initiates a catalytic secondary reaction are likewise already known. For instance, U.S. Pat. No. 3,915,706 describes photoinitiators which produce a strong acid which in a secondary reaction then cleaves acid labile groups, such as polyaldehyde groups.

The prior art (DE-A-3,406,927) also discloses radiation sensitive mixtures based on acid cleavable compounds which contain as the binder a polymer which is soluble in aqueous alkali, a compound which photochemically forms a strong acid, and a further compound containing acid cleavable bonds, which by the action of the acid become more soluble in an alkaline developer. Compounds mentioned as photochemically forming a strong acid are diazonium, phosphonium, sulfonium and iodonium compounds and also halogen compounds. The use of these onium salts as photochemical acid donors in resist materials is also known for example from U.S. Pat. No. 4,491,628. A review of the use of onium salts in resist materials is given by Crivello in Org. Coatings and Appl. Polym. Sci. 48 (1985), 65–69. The disadvantage of these photoinitiators is that on irradiation they do not change in such a way as to produce in addition to the acids formed any further photoproducts which increase the solubility in the alkaline developer. Furthermore, these mixtures of necessity require three components and are only positive working.

Radiation sensitive mixtures of polymers having acid labile t-butyl carbonate or t-butyl ester side groups and photochemical acid donors are known for example from U.S. Pat. No. 4,491,628 and FR-A-2,570,844. These mixtures work not only positively but also negatively on development with either a polar or an apolar solvent.

Also known to the art are light sensitive recording materials which contain tetrahydropyranyl ether, an acid donor photoinitiator and an optional polymeric binder (DE-A-2,306,248). These mixtures likewise work only positively.

Furthermore, positive and negative working mixtures are known that consist of phenolic resins, specifically novolaks, and onium salts. These mixtures are positive working if they are irradiated and developed with alkaline developers. They are negative working if the mixtures are heated to render the irradiated areas insoluble in alkaline developers and then uniformly exposed once more to render the previously unexposed areas alkali soluble and subsequently removable with alkaline developers (EP-A-146,411). The positive working mixtures have the disadvantage that they are relatively insensitive, while the negative working mixtures require a large number of process steps.

DE-A-3,721,741 describes radiation sensitive mixtures which contain a polymeric binder that is soluble in aqueous alkaline solutions and an organic compound whose solubility in an aqueous alkaline developer is increased by the action of acid, which contains at least one acid cleavable group and which on irradiation produces a strong acid. These mixtures are positive working.

It is an object of the present invention to provide highly reactive radiation sensitive systems for relief pattern production which are developable with aqueous alkaline solutions and are not only positive but also negative working.

We have found, surprisingly, that this object is achieved by the preparation of radiation sensitive mixtures of high sensitivity which are developable with alkalis not only positively but also negatively without any need for additional process steps.

The present invention accordingly provides a radiation sensitive mixture containing (a) a polymeric binder and
(b) an organic compound whose solubility in an aqueous alkaline developer is increased by the action of acid and which contains at least one acid cleavable group and additionally a group which forms a strong acid on irradiation, wherein the polymeric binder (a) is a reaction product of a polymer that contains phenolic hydroxyl groups with dihydropyran or with an alkyl vinyl ether or is a polymer or polycondensate obtained by polymerization or polycondensation of reaction products of monomeric compounds that contain phenolic hydroxyl groups with dihydropyran or with an alkyl vinyl ether.

In the polymeric binder (a) preferably from 10 to 100% of the phenolic hydroxyl groups originally present in the polymer can have been reacted with dihydropyran or with an alkyl vinyl ether, possible polymeric binders (a) being not only reaction products of novolak based on p-cresol/formaldehyde with dihydropyran or with an alkyl vinyl ether but also reaction products of poly(p-hydroxystyrene), poly(p-hydroxy-α-methylstyrene) or a copolymer of p-hydroxystyrene and p-hydroxy-α-methylstyrene with dihydropyran or with an alkyl vinyl ether.

Preferred organic compounds (b) are sulfonium salts of the general formula (I)

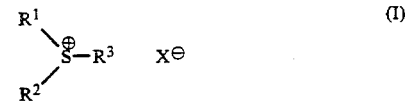

where $R^1$, $R^2$ and $R^3$ are identical to or different from one another and each is singly acyclyl or aryl which each may contain heteroatoms, or two of $R^1$ to $R^3$ together form a ring, with the proviso that at least one of $R^1$ to $R^3$ contains one or more acid cleavable groups, one of $R^1$ to $R^3$ can be linked to one or more further sulfonium salt residues directly or via acid cleavable groups, and $X^\ominus$ is a nonnucleophilic counterion.

The present invention also provides a process for producing relief patterns and relief images using a radiation sensitive mixture according to the invention as a coating material.

Positive resist patterns are obtained with the radiation sensitive mixtures according to the invention on heating the irradiated material at from 60° C. to 90° C. and then developing with alkaline developers. Negative resist patterns are obtained via the same method except that irradiation is followed by heating at from 120° C. to 200° C.

There now follow specifics concerning the buildup components of the radiation sensitive mixtures according to the invention.

The starting materials for preparing the polymeric binder (a) to be used according to the invention are preferably phenolic resins, for example novolaks, in particular those based on p-cresol/formaldehyde, poly(p-hydroxystyrenes, poly(p-hydroxy-α-methylstyrenes) or copolymers of p-hydroxystyrene and p-hydroxy-α-methylstyrene. These phenolic resins are completely or partially reacted with dihydropyran or alkyl vinyl ethers to end up containing, for example in the case of the reaction product with dihydropyran, groups of the general formula (II)

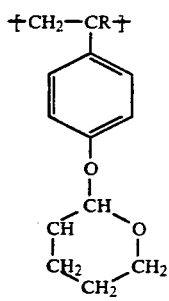

(II)

where R is H or alkyl of 1-3 carbon atoms.

Suitable novolak starting materials are for example those described in Novolak Resins Used in Positive Resist Systems by T. Pampalone in Solid State Technology, June 1984, 115-120. For specific applications, for example exposure in deep UV, preferred novolaks are made from p-cresol and formaldehyde. These novolaks can then be reacted for example with dihydropyran or alkyl vinyl ethers in the presence of catalytic amounts of hydrochloric acid in for example ethyl acetate in such a way as to etherify all or some of the phenolic OH groups.

Phenolic resins based on hydroxystyrenes are copolymerizable in a conventional manner by a free radical or ionic mechanism from a plurality of unsaturated monomers. Preferred copolymerizable unsaturated components are for example substituted and unsubstituted hydroxystyrenes, such as p-hydroxystyrene, m-hydroxystyrene, p-(tetrahydropyranyloxy)styrene and p-hydroxy-α-methylstyrene.

These hydroxystyrene based polymers according to the invention can likewise be reacted by polymer analogous reaction of for example poly(p-hydroxystyrene) with the corresponding stoichiometric amounts or less than stoichiometric amounts of for example dihydropyran or alkyl vinyl ethers.

Suitable alkyl vinyl ethers are those of from 1 to 8, preferably from 2 to 6, in particular from 2 to 4, carbon atoms in the alkyl group, which can be linear, branched or even cyclic. Particular preference is given to the reaction of condensates or polymers that contain phenolic hydroxyl groups with dihydropyran.

Preferably, according to the invention, from 10 to 100%, in particular from 15 to 30%, of the phenolic hydroxyl groups of the polymeric binder will have been etherified with alkyl vinyl ether or dihydropyran.

The composition of the copolymers (a) can be determined by H-NMR spectroacopy.

Component (a) is present in the radiation sensitive mixture according to the invention in an amount of from 70 to 98%, preferably from 80 to 95% by weight, based on the sum of (a) and (b).

Preferred organic compounds (b) are those which contain at least one sulfonium salt group and at least one t-butyl carbonate group or at least one silyl ether group. However, it is also possible to use other compounds which on irradiation form a strong acid and contain an acid cleavable bond in the same molecule.

Preferred organic compounds (b) of this type are those of the general formula (I)

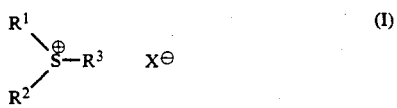

(I)

where $R^1$, $R^2$ and $R^3$ are identical to or different from one another and each is singly acyclyl or aryl which each may contain heteroatoms, or two of $R^1$ to $R^3$ together form a ring, with the proviso that at least one of $R^1$ to $R^3$ contains one or more acid cleavable groups, one of $R^1$ to $R^3$ can be linked to one or more further sulfonium salt residues directly or via acid cleavable groups, and $X^\ominus$ is a nonnucleophilic counterion, for example a dimethyl-4-t-butoxycarbonyloxyphenylsulfonium salt with hexafluoroarsenate, hexafluoroantimonate, hexafluorophosphate and/or hexafluoroborate as counterion, a phenylbis(4-t-butoxycarbonyloxyphenyl)sulfonium salt with the counterions mentioned, a tris(4-t-butoxycarbonyloxyphenyl)sulfonium salt with the counterions mentioned, a 4-hydroxyphenylbis(4-t-butoxycarbonyloxyphenyl)sulfonium salt with the counterions mentioned or a 1-naphthyl-4-trimethylsilyloxytetramethylenesulfonium salt with the counterions mentioned.

Particularly preferred organic compounds (b) of this type are those of the general formula (III)

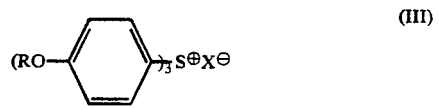

(III)

where R can be H, t-butoxycarbonyl or trialkylsilyl, with the proviso that at least one of the radicals R is

hydrogen.

The preparation of the abovementioned sulfonium salts is described for example in DE-A-3,721,741 and DE-A-3,721,740.

The organic compound (b) is present in the mixture according to the invention in general in an amount of from 2 to 30, preferably from 5 to 20, percent by weight, based on the total amount (=sum) of (a) and (b).

The radiation sensitive mixtures according to the invention are sensitive to X-rays, electron beams and UV radiation. If desired, sensitizers may be added in small amounts, for example pyrene and perylene, in order to sensitize the compounds in from the longer wave UV to the visible wavelength region. Irradiation in specific wavelength regions, for example in the shortwave UV region (<300 nm), requires a high transparency of the layers at the particular irradiation wavelength. Conventional exposure units based on mercury lamps make use of the 254 nm line, and excimer lasers emit at 248 nm (KrF). Radiation sensitive recording materials should therefore have very low optical densities in this region. The novolak based polymeric binders according to the invention have turned out to be less suitable for these applications, so that for these specific applications it is preferred to use the polymeric binders based on hydroxystyrenes.

In the novel process for producing positive relief patterns, a radiation sensitive recording layer consisting essentially of the radiation sensitive mixture according to the invention is subjected to imagewise exposure at such a rate that following a thermal bake at from 60° C. to 90° C. the solubility of the exposed areas in aqueous alkaline solvents increases and these areas can be selectively removed with the alkaline developer.

In the novel process for producing negative relief patterns, the radiation sensitive recording layer is subjected to imagewise exposure at such a rate that following a thermal bake at from 120° C. to 200° C. the exposed areas are no longer soluble in an aqueous alkaline developer. The unexposed areas, on the other hand, are completely removable after this treatment with the aqueous alkaline developer.

It is preferable to dissolve for example the polymeric binder (a), for example poly-p-hydroxystyrene, in which the phenolic monomer component has been reacted with alkyl vinyl ethers or dihydropyran to an extent of from 10 to 100%, and from 5 to 20% by weight, particularly preferably from 5 to 15% by weight, of a compound of type (b), based on the total weight of compounds (a) and (b), in a suitable inert solvent, for example in methylglycol acetate or methyl propylene glycol acetate, so that the solids content is from 10 to 30% by weight.

The solution can be filtered through a filter having a pore diameter of 0.2 μm. The resulting resist solution is spincoated at from 1,000 to 10,000 rpm onto a wafer (for example a silicon wafer which has been oxidized at the surface) to form a resist film about 1 μm in thickness. The wafer is then heated at 90° C. or 80° C. for from 1 to 5 minutes. The films thus obtained are irradiated through a chromium coated structured quartz mask with UV light from a mercury lamp, with excimer laser light, with electron beams or with X-rays. The irradiated films are baked at from 60° C. to 90° C. for from 5 seconds to 2 minutes or at from 120° C. to 200° C. for from 10 seconds to 2 minutes. The films thus treated are then developed with alkaline or alcoholic developers, and the exposed areas dissolve away selectively if the lower baking temperatures of from 60° C. to 90° C. were used, and the unexposed areas dissolve away selectively if the bake was carried out at equal to or higher than 120° C.

Suitable developers are those commercially available, for example those based on sodium hydroxide, sodium silicate, potassium silicate or tetraalkylammonium hydroxides.

The radiation sensitive mixtures according to the invention are notable in particular for high sensitivity, good resolution and ready processibility and therefore are particularly advantageously suitable for lithography in the shortwave UV region.

In the Examples, parts and percentages are by weight, unless otherwise stated.

Synthesis of polymers 2 parts of poly(p-hydroxystyrene) of molecular weight $\overline{M}_w$ (light scattering)=62,000 g/mol are dissolved in 20 parts of ethyl acetate. 10 parts of dihydropyran and 0.5 part of concentrated hydrochloric acid are added. The mixture is reacted at room temperature for 62 hours and then precipitated in naphtha. The polymer is washed with dilute sodium bicarbonate solution and dried at 50° C. under reduced pressure. IR and H-NMR spectroscopy show that the phenolic OH function has been completely etherified and that a tetrahydropyranyl ether of poly(p-hydroxystyrene) has formed.

The same method is used to prepare polymers having partly etherified phenolic groups by addition of the appropriate stoichiometric amounts of dihydropyran.

EXAMPLE 1

Preparation of resist solution

A photoresist solution is prepared from 10 parts of tris(4-t-butoxycarbonyloxyphenyl)sulfoniumhexafluoroarsenate, 90 parts of a copolymer having p-hydroxystyrene and p-2-tetrahydropyranyloxystyrene units (75:25) (molecular weight $\overline{M}_n$: 22,000 g/mol (GPC)) and 400 parts of methyl propylene glycol acetate. The solution is then filtered through a filter having a pore diameter of 0.2 μm.

Lithographic tests a) Positive process

The resist solution is spincoated at 7,900 rpm in a layer thickness of 1.07 μm onto an SiO$_2$ coated silicon wafer. The wafer is dried at 90° C. for one minute and is then subjected to imagewise exposure through a structured contact test mask under excimer laser light of wavelength 248 nm for 15 seconds. This is followed by heating at 70° C. for 60 seconds and development with an alkaline developer (pH 12.3) for 60 seconds. The exposed areas have been completely removed leaving as the resist pattern a positive image of the mask. The sensitivity is 100 mJ/cm$^2$.

b) Negative process

The resist solution is spincoated as in a) in a layer thickness of 1.005 μm and dried at 90° C. for 1 minute. This is followed by imagewise exposure through a contact test mask under excimer laser light of wavelength 248 nm for 20 seconds and baking at 120° C. for 1 minute. Following 90 seconds' development with the alkaline developer (pH 12.3), the unexposed areas have been completely removed, leaving a layer thickness of about 1 μm in the exposed areas. The sensitivity is 70 mJ/cm². Negative patterns of the mask are produced.

EXAMPLE 2

A photoresist solution is prepared from 10 parts of tris(4-t-butoxycarbonyloxyphenyl)sulfoniumhexafluorophosphate, 90 parts of a copolymer containing p-hydroxystyrene and p-2-tetrahydropyranyloxystyrene units (90:10) (molecular weight $\overline{M}_n$ 16,500 g/mol (GPC)), and 400 parts of methyl propylene glycol acetate. The solution is then filtered through a filter having a pore diameter of 0.2 μm.

The resist solution is spincoated at 9,820 rpm in a layer thickness of 0.99 μm onto an $SiO_2$ coated silicon wafer. The wafer is dried at 90° C. for one minute and then subjected to imagewise exposure through a structured contact test mask under excimer laser light of wavelength 248 nm for 15 seconds. This is followed by baking at 80° C. for 60 seconds and development with a developer of pH 12.3 over 60 seconds. The exposed areas have been completely removed, and the resist patterns are a positive image of the mask. The sensitivity is 250 mJ/cm².

Baking this mixture, after it has been exposed, at 120° C. likewise produces negative structures. The sensitivity is 100 mJ/cm².

We claim:

1. A radiation sensitive mixture containing
   (a) a polymeric binder and
   (b) an organic compound whose solubility in an aqueous alkaline developer is increased by the action of acid and which contains at least one acid cleavable group and additionally a group which forms a strong acid on irradiation,
   wherein the polymeric binder (a) is a reaction product of a polymer that contains phenolic hydroxyl groups with dihydropyran or with an alkyl vinyl ether or is a polymer or polycondensate obtained by polymerization or polycondensation of reaction products of monomeric compounds that contain phenolic hydroxyl groups with dihydropyran or with an alkyl vinyl ether.

2. A radiation sensitive mixture as recited in claim 1, wherein in the polymeric binder (a) from 10 to 100% of the phenolic hydroxyl groups originally present in the polymer have been reacted with dihydropyran or an alkyl vinyl ether.

3. A radiation sensitive mixture as recited in claim 1, wherein the polymeric binder (a) is a reaction product of a novolak based on p-cresol/formaldehyde with dihydropyran or with an alkyl vinyl ether.

4. A radiation sensitive mixture as recited in claim 2, wherein the polymeric binder (a) is a reaction product of a novolak based on p-cresol/formaldehyde with dihydropyran or with an alkyl vinyl ether.

5. A radiation sensitive mixture as recited in claim 1, wherein the polymeric binder (a) is a reaction product of poly(p-hydroxystyrene), poly(p-hydroxy-α-methylstyrene) or a copolymer of p-hydroxystyrene and p-hydroxy-α-methylstyrene with dihydropyran or with an alkyl vinyl ether.

6. A radiation sensitive mixture as recited in claim 2, wherein the polymeric binder (a) is a reaction product of poly(p-hydroxystyrene), poly(p-hydroxy-α-methylstyrene) or a copolymer of p-hydroxystyrene and p-hydroxy-α-methylstyrene with dihydropyran or with an alkyl vinyl ether.

7. A radiation sensitive mixture as recited in claim 1, wherein the organic compound (b) is a sulfonium salt of the general formula (I)

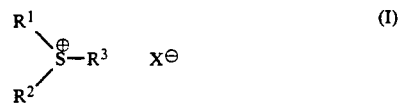

where $R^1$, $R^2$ and $R^3$ are identical to or different from one another and each is singly acyclyl or aryl which each may contain heteroatoms, or two of $R^1$ to $R^3$ together form a ring, with the proviso that at least one of $R^1$ to $R^3$ contains one or more acid cleavable groups, one of $R^1$ to $R^3$ can be linked to one or more further sulfonium salt residue directly or via acid cleavable groups, and $X^\ominus$ is a nonnucleophilic counterion.

* * * * *